United States Patent [19]

Chang et al.

[11] Patent Number: 4,810,665
[45] Date of Patent: Mar. 7, 1989

[54] SEMICONDUCTOR DEVICE AND METHOD OF FABRICATION

[75] Inventors: Mike F. Chang, Liverpool; George C. Pifer, North Syracuse, both of N.Y.

[73] Assignee: General Electric Company, Somerville, N.J.

[21] Appl. No.: 77,711

[22] Filed: Jul. 24, 1987

Related U.S. Application Data

[62] Division of Ser. No. 817,707, Jan. 10, 1986, abandoned.

[51] Int. Cl.⁴ .................... H01L 21/265; H01L 21/22
[52] U.S. Cl. .......................................... 437/30; 437/41; 437/27; 437/149; 437/203; 437/152; 357/23.4
[58] Field of Search ............... 357/23.4, 89, 90, 23.14; 437/203, 27, 28, 29, 30, 41, 149, 152

[56] References Cited

U.S. PATENT DOCUMENTS

| 4,072,975 | 2/1978 | Ishitani | 357/23.4 |
|---|---|---|---|
| 4,345,265 | 8/1982 | Blanchard | 357/23.4 |
| 4,364,073 | 12/1982 | Becke et al. | 357/23.4 |
| 4,417,385 | 11/1983 | Temple | 357/23.4 |
| 4,443,931 | 4/1984 | Baliga et al. | 437/59 |
| 4,466,176 | 8/1984 | Temple | 357/23.4 |
| 4,503,598 | 3/1985 | Vora et al. | 357/23.4 |
| 4,532,534 | 7/1985 | Ford et al. | 357/23.4 |
| 4,543,596 | 9/1985 | Strack et al. | 357/23.4 |
| 4,587,713 | 5/1986 | Goodman et al. | 357/23.4 |
| 4,631,564 | 12/1986 | Neilson et al. | 357/23.4 |
| 4,639,762 | 1/1987 | Neilson et al. | 357/23.4 |
| 4,641,162 | 2/1987 | Yilmaz | 357/23.4 |
| 4,672,407 | 6/1987 | Nakagawa et al. | 357/23.4 |
| 4,680,604 | 7/1987 | Nakagawa et al. | 357/23.4 |
| 4,705,759 | 1/1983 | Lidow et al. | 437/30 |

FOREIGN PATENT DOCUMENTS 5046081 8/1973 Japan .

Primary Examiner—Brian E. Hearn
Assistant Examiner—M. Wilczewski
Attorney, Agent, or Firm—K. R. Glick; Birgit E. Morris

[57] ABSTRACT

A semiconductor device, such as a MOSFET or IGT, with a deep base region having a high dopant concentration at least as high as $5 \times 10^{19}$ atoms per cubic centimeter and a method of fabrication are disclosed. The novel method involves formation of the deep base region at a later stage in the fabrication and reduces the leaching of dopant from the deep base region, as well as achieving greater control over the dopant concentration in the deep base region. Further, the increased dopant concentration in the deep base region lowers the base shunt resistance of the device to provide improved electrical ruggedness. For IGTs, parasitic thyristor action is reduced.

9 Claims, 3 Drawing Sheets

SEMICONDUCTOR DEVICE AND METHOD OF FABRICATION

This application is a division of application Ser. No. 817,707, filed 1/10/86 now abandoned.

BACKGROUND OF THE INVENTION

The present invention relates generally to a method of fabricating a semiconductor device of improved electrical characteristics which has a deep base portion and more particularly to a method of fabricating a semiconductor device, such as a MOSFET or an insulated gate transistor (IGT), having a deep base portion with a high dopant concentration to provide improved electrical ruggedness.

A method of fabricating semiconductor devices having a deep base portion is described in U.S. Pat. No. 4,443,931, which is assigned to the assignee of the present invention. In accordance with the method described in the patent, a deep P+ base region is formed in a drift region of a power MOSFET prior to formation of the remainder of the base portion. Later processing steps require the growth of an oxide layer on the wafer surface in which the deep P+ base region has been formed. During the subsequent processing steps, this oxide layer has a tendency to leach out some of the dopant of the base region, thus lowering the dopant concentration level and increasing the resistivity of this region in the finished device.

A high dopant concentration in the deep base portion of a MOSFET or of an IGT, both fabricated by similar methods, improves the electrical ruggedness of the device by reducing sporadic disruptive breakdowns of the P-N junction during high voltage operation. Additionally, in an IGT a high dopant concentration in the deep base region decreases the base shunt resistance, thereby reducing parasitic thyristor action of the IGT.

The initial dopant concentration level of the deep P+ base region during device fabrication is limited by several problems, including the permissible density of surface defects caused by doping and the limit of solid solubility of the dopant in a silicon wafer. After the initial doping of the deep P+ base region, subsequent fabrication steps are performed with one or more oxide layers overlying the base region. These oxide layers tend to leach out dopant from the deep P+ base region. Thus, prior art fabrication methods are limited in the impurity concentration levels in the deep base region of the finished device to about $10^{18}$ atoms per cubic centimeter. A further problem in prior art fabrication methods is that the final dopant concentration level of the deep base portion cannot be precisely controlled.

OBJECTS OF THE INVENTION

It is therefore a primary object of the present invention to provide a new and improved method of fabricating a semiconductor device, such as a MOSFET or an IGT, which is not subject to the foregoing problems and disadvantages.

It is an additional object of the present invention to provide a new and improved semiconductor device having improved electrical ruggedness.

It is another object of the present invention to provide a new and improved semiconductor device with a deep base region having a high dopant concentration level.

It is still another object of the present invention to provide a new and improved method of fabricating a semiconductor device having improved electrical ruggedness.

It is a further object of the present invention to provide a method of fabricating a semiconductor device with a deep base region having a high dopant concentration level.

It is yet another object of the present invention to provide a method of fabricating a semiconductor device having a deep base region wherein the dopant concentration of the finished device can be more precisely controlled.

It is still another object of the present invention to provide a method of fabricating an IGT having a reduced base shunt resistance to prevent parasitic thyristor action during operation of the device.

SUMMARY OF THE INVENTION

The foregoing objects of the invention are achieved by a semiconductor device which has a base region that includes a deep portion having a high dopant concentration. The increased dopant concentration lowers the base shunt resistance of the device to provide improved electrical ruggedness.

Further, the invention provides a novel fabrication method wherein greater control over the dopant concentration level in the deep base region is achieved. More specifically, fabrication begins with a wafer of semiconductor material comprising a substrate with an epitaxial layer thereon of a first conductivity type (e.g. N-type). A first insulating layer is formed on a major surface of the wafer layer and then a refractory electrode layer is formed atop the first insulating layer. A first window is opened in the refractory electrode layer and a base region of predetermined depth is formed in the epitaxial layer by introducing a second conductivity type of dopant (e.g. P-type) through the first window and through the first insulating layer. A first mask layer is then formed at least over the first window.

A second window is opened within the walls of the first window and extends through the first insulating layer to the aforesaid major surface. A deep base region is formed in the epitaxial layer by introducing the second type of dopant (e.g. P+) through the second window. The formation of the deep base region at this stage of the fabrication process reduces leaching of the dopant therefrom by reducing the number of processing steps during which insulating oxide layers applied during subsequent steps overlie the deep base region. A second mask layer is then formed on the portion of the major surface exposed by the second window.

The remaining portion of the first mask layer is then removed and a third window, extending between the walls of the first window and the second mask layer, is opened. This is accomplished by the removal of the portion of the first insulating layer between the walls of the second mask layer and the wall of the first window so as to expose the portion of the major surface therebetween. The first type of dopant is introduced through the third window to form an emitter region in the epitaxial layer and within the base region. A second insulating layer is then formed over the exposed portions of the refractory electrode, the major surface and the second mask layer, respectively.

A fourth window is then opened within the first window by removing the second mask layer and substantially all of the second insulating layer within the first window except on the walls thereof. A metallized electrode is then applied to the major surface exposed by the fourth window. The surface dopant concentration level in the resulting deep base region is about $5 \times 10^{19}$ atoms per cubic centimeters or greater.

These and other objects of the present invention, together with the features and advantages thereof, will become apparent from the following detailed specification, when considered in conjunction with the accompanying drawings in which applicable reference numerals have been carried forward. Further, the dimensions of the various components shown in the drawings are not intended to be representative. Such dimensions are occasionally shown expanded in order to illustrate pertinent features of the invention.

DETAILED DESCRIPTION OF THE INVENTION

Figure 1:
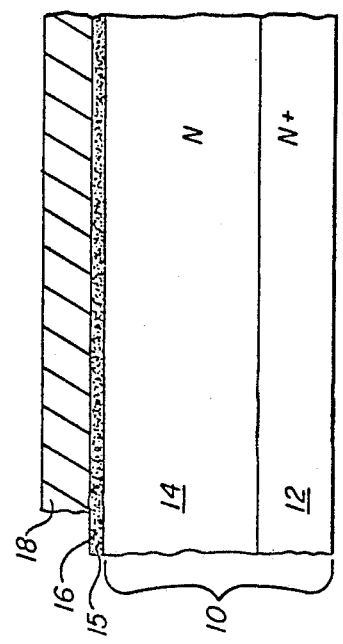

FIGS. 1-10 illustrate various steps in the fabrication of a single cell of a MOSFET. As shown in FIG. 1, a wafer 10 is initially provided, preferably of silicon semiconductor material, comprising an N+ substrate 12 having an N epitaxial or wafer layer or drift region 14 thereon. N layer 14 includes a major surface 15 of the wafer. In the preferred embodiment, substrate 12 may comprise a commercially available silicon material doped with antimony to an impurity concentration level of about $10^{19}$ atoms per cubic centimeter. N layer 14 may typically be epitaxially grown on substrate 12, and will have a thickness which will vary depending on the application for which the device is intended. N layer 14 has a phosphorous dopant concentration of about $10^{15}$ atoms per cubic centimeter.

In accordance with a preferred embodiment of the present invention, a first insulating oxide layer 16, e.g. silicon dioxide, is formed on major surface 15, preferably by thermal growth which results when wafer 10 is placed in a heated furnace together with an oxidizing gas. Oxide layer 16 may also be formed by other processes, such as deposition on wafer 10. Further, other insulating layers may be used in lieu of oxide layer 16. In either case, layer 16 is deposited in a thickness of about 1,000 Angstroms. A gate electrode layer 18 (shown partially removed), comprising polysilicon or other refractory material, is next deposited on oxide layer 16. This may be suitably done using a process known as low pressure chemical vapor deposition (LPCVD). Layer 18 is deposited to a thickness of about 5,000 Angstroms.

Figure 2:
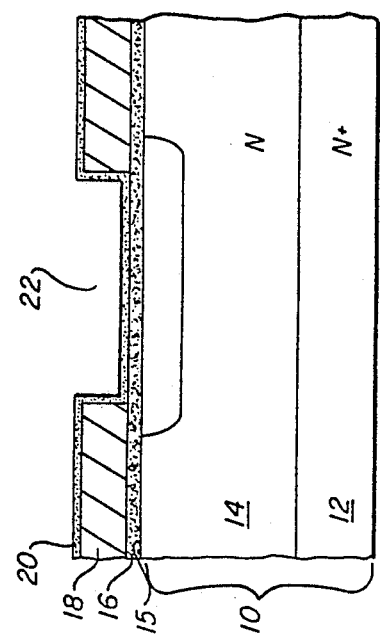

As illustrated in FIG. 2, a first window 22 is opened in gate layer 18, preferably using photolithographic etching techniques. Oxide layer 16 remains in place. The shape of window 22 establishes the shape of the cell of the MOSFET being fabricated, e.g. a rectangular window 22 results in a rectangular cell. A protective oxide layer 20, having a thickness of about 500 Angstroms, is then formed on the exposed surfaces of gate electrode layer 18 and on oxide layer 16, preferably by thermal growth.

Figure 3:
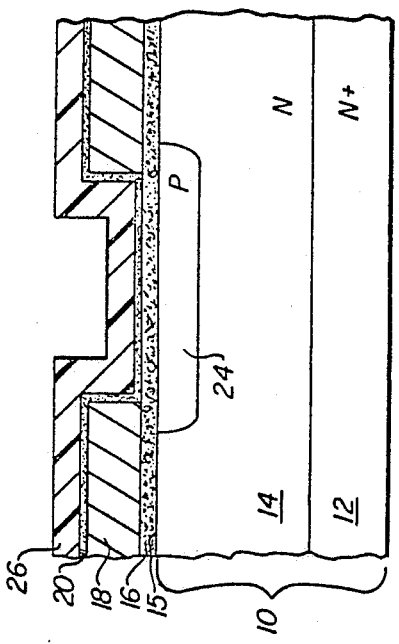
FIGS. 1-10 are schematic views showing in cross-section a single cell of a MOSFET during different steps of the fabrication process in accordance with the present invention.

Next, as shown in FIG. 3, a P-type dopant, such as boron, is implanted through oxide layer 16 into wafer 10, preferably by high energy implantation. The dopant is driven in by heating to form a first region 24 comprising a P base region. The depth of the implantation depends on the drive-in temperature, but may typically be between about 1.5 and 5 microns as measured from major surface 15. As further illustrated in FIG. 3, a first mask layer of silicon nitride ($Si_3N_4$) 26 is next deposited on the MOSFET cell of FIG. 2, preferably by LPCVD of a reaction product of silane ($SiH_4$) and ammonia ($NH_3$).

Figure 4:
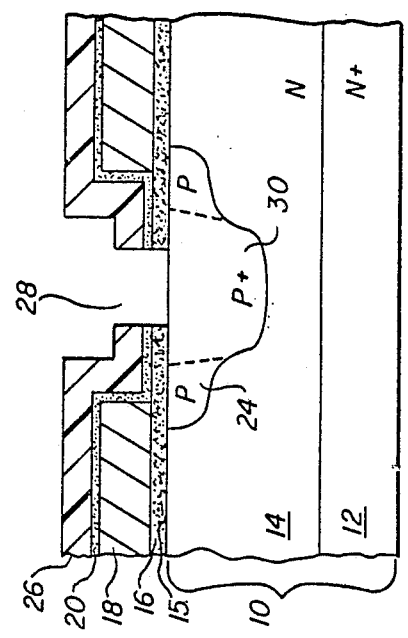

As illustrated in FIG. 4, a second window 28 is opened and is located centrally between the walls of window 22. Window 28 extends through silicon nitride layer 26 and oxide layers 20 and 16 to expose a portion of major surface 15. A suitable procedure to accomplish this is to first plasma etch away silicon nitride layer 26 in the area of window 28 and then to etch away the exposed portions of oxide layers 16 and 20 with a hydrofluoric acid (HF) based solution. Next, a layer of P-type dopant, such as boron nitride, is deposited on the exposed portion of major surface 15 within window 28. This dopant is driven into wafer 10 by heating to form a second region 30 comprising a deep P+ base region. Region 30 has a predetermined depth between about 3-6 microns as measured from surface 15, depending on the desired device rating.

By forming the deep P+ base region at this stage of fabrication, problems associated with the leaching out of the dopant by any overlying oxide layer are reduced. More specifically, the formation of the deep P+ base region at a later stage in the fabrication process than is the case in the prior art results in less exposure of the region to the overlying oxide layers and therefore less of the dopant is leached out. As a consequence, final dopant concentration levels of greater than about $5 \times 10^{19}$ atoms per cubic centimeter are achievable in the fabrication process according to the present invention.

Figure 5:
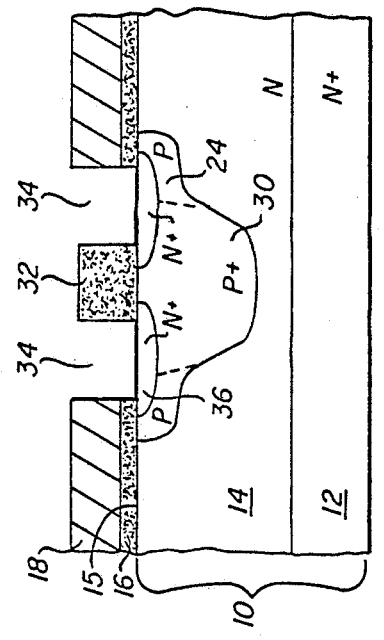

Next, as illustrated in FIG. 5, a second mask layer in the form of an oxide layer 32 is formed on major surface 15 and completely fills window 28. The formation of layer 32 occurs preferably by thermal growth during the drive-in heating step for the formation of deep P+ base region 30. Oxide layer 32 must be thicker than oxide layer 16, for reasons that will become apparent below.

Figure 6:
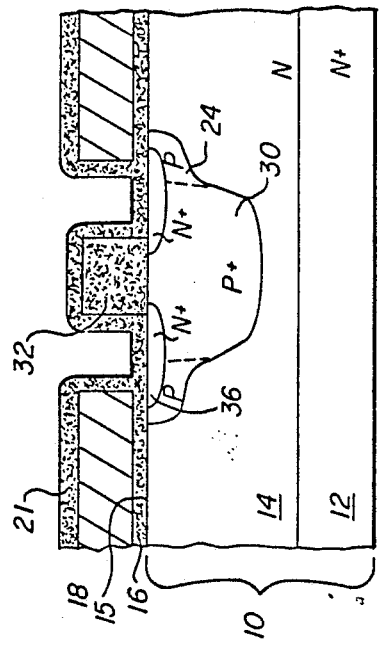

As illustrated in FIG. 6, silicon nitride layer 26 is subsequently removed, for example by placing wafer 10 in phosphoric acid heated to about 180° C. This procedure does not affect any of the oxide layers, i.e., layers 16, 20 and 32, which remain.

Figure 7:
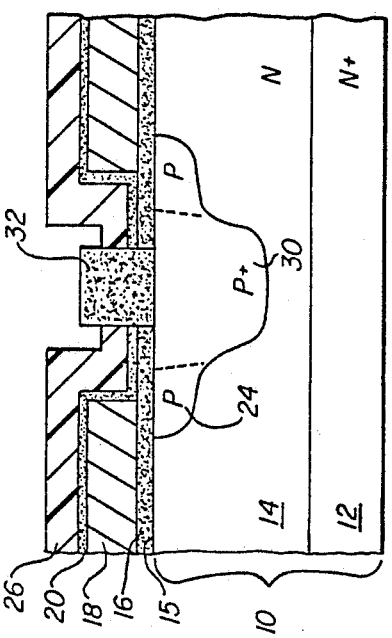

Next, as illustrated in FIG. 7, oxide layer 20 and those portions of oxide layer 16 which do not underlie layer 18 are removed along with portions of oxide layer 32. This procedure is suitably accomplished by immersing wafer 10 in a hydrofluoric acid based solution for a predetermined time. Because of the greater thickness of layer 32, this immersion does not completely remove layer 32, but leaves behind a portin thereof to act as a mask for the introduction of the emitter region dopant. The last-described removal step opens a third window 34, which extends between the walls of window 22 (FIG. 2) and the remaining portion of oxide layer 32 centrally situated within window 22. An N-type dopant, such as phosphorus or arsenic, is then introduced through window 34 into wafer 10. This is preferably done by ion implantation and forms a third region providing an N+ source or emitter region 36 of shallow depth (e.g. 1 micron as measured from surface 15). Gate electrode layer 18 is concurrently doped. The resultant impurity concentration level in N+ source region 36 and in gate electrode layer 18 is about $5 \times 10^{19}$ atoms per cubic centimeter. It should be noted that gate electrode layer 18 may alternatively be doped at an earlier fabrication stage, or even during the formation of layer 18.

Figure 8:
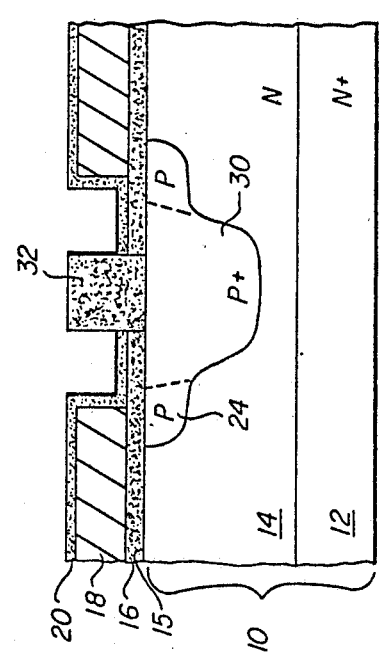

As illustrated in FIG. 8, a second insulating oxide layer 21 is next formed on the upper surface of gate electrode layer 18, as well as on the exposed portions of layers 16 and 18, of major surface 15 and of layer 32. This is preferably done by a combination of thermal oxidation and CVD.

Figure 9:
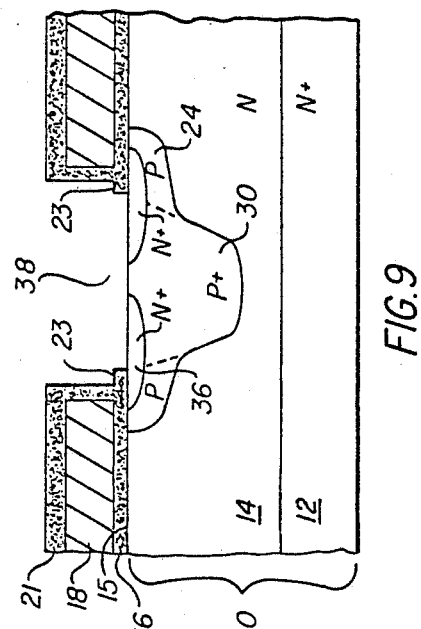

Next, as illustrated in FIG. 9, a photolithographic technique is used to open a fourth window 38, herein referred to as a contact window, through oxide layers 21 and 32. This procedure is suitably accomplished by immersing wafer 10 in a hydrofluoric acid-based solution for an interval sufficient to remove the oxide layers exposed by the contact window mask. Contact window 38 extends down to major surface 15 and exposes deep P+ base region 30 and a portion of N+ source region 36 at the latter surface. As shown in FIG. 9, contact window 38 is narrower than window 22 by the thickness of layer 21 on the walls of the latter. Further, the last-described removal step leaves portions 23 of layer 21 on surface 15.

Figure 10:
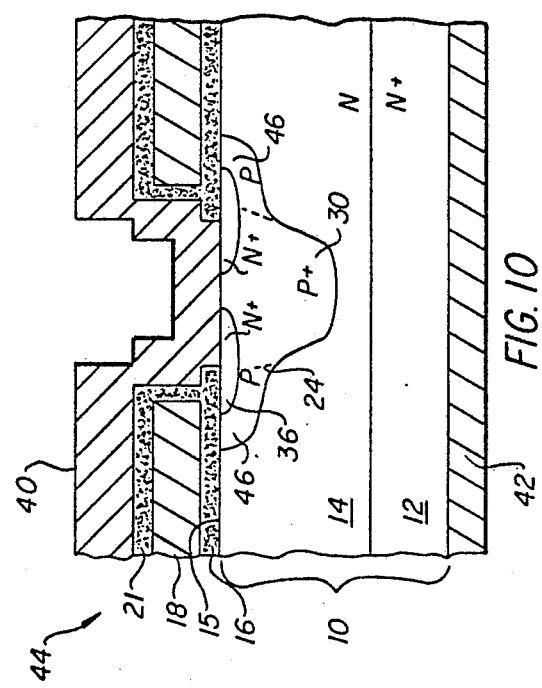

As illustrated in FIG. 10, a source metallization layer 40 is next applied to wafer 10, for example by evaporation of aluminum or an aluminum alloy. A collector metallization layer 42 may be deposited at this time on substrate 12 to complete the fabrication of MOSFET cell 44.

In operation, source metallization layer 40 and collector metallization layer 42 are appropriately biased and a gate control voltage is applied to gate electrode 18 to induce a channel region 46 in base region 24 at major surface 15, between drift region 14 and source region 36, as shown in FIG. 10. The flow of current through MOSFET cell 44 is thus controlled by variation of the gate control voltage.

Figure 11:
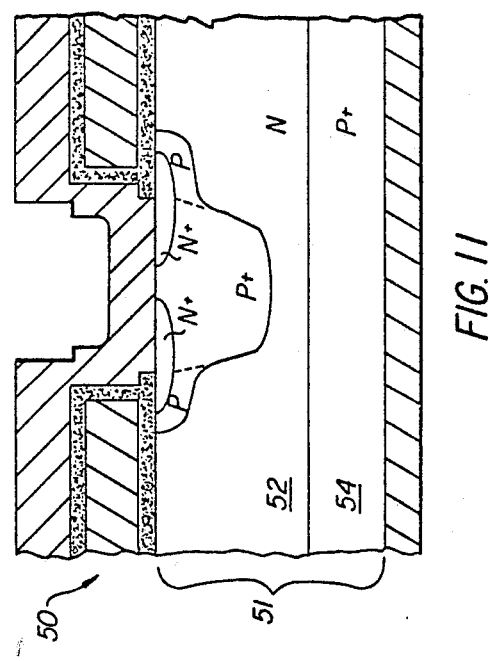
FIG. 11 is a schematic view in cross-section illustrating an IGT fabricated in accordance with the present invention.

The present invention is not limited to the fabrication of power MOSFETs and the method described herein can be used to fabricate other semiconductor devices which have a base region that includes a deep portion. For example, an IGT of the type illustrated at 50 in FIG. 11 may be so fabricated. IGT 50 is similar in construction to MOSFET 44 (FIG. 10). However, while the latter includes a wafer 10 having N layer 14 on N+ substrate region 12, in IGT 50 a wafer 51 is provided having an N layer 52 on a P+ collector substrate 54. Accordingly, IGT 50 can be fabricated using substantially the same steps as are used in the fabrication of MOSFET 44, taking into account differences in substrate dopant type.

An additional advantage of increasing the dopant concentration of the deep base region becomes evident when the fabrication method of the present invention is used with IGTs. In operation, the increased conductivity of the base region of the IGT reduces the base shunt resistance and thus acts to suppress parasitic thyristor action of IGT cells. Thus, the latch-up current threshold of such devices is increased.

In a semiconductor device constructed according to the invention fabrication method herein described, the dopant concentration level in the deep base region is more precisely controllable as a result of reduced leaching of the dopant by the oxide layers during fabrication. Additionally, the electrical ruggedness of the overall device is improved by reducing sporadic breakdowns of the P-N junction during high voltage operation.

It will be apparent to those skilled in the art that the dopant types described in connection with the preferred embodiment of the invention method may be reversed to provide complementary devices. Thus, the invention has been described to provide a method of making an N-channel device. The invention will work equally well to provide a P-channel device by reversing the dopant types used.

While the present invention has been shown and described with reference to a preferred embodiment, it will be understood that numerous modifications, changes, variations and equivalents will now occur to those skilled in the art without departing from the spirit and scope of the invention. Accordingly, it is intended that the invention herein be limited only by the scope of the appended claims.

What is claimed is:

1. A process of fabricating a semiconductor device of improved electrical ruggedness on a wafer of semiconductor material, said wafer comprising a substrate and a wafer layer thereon containing a first type of dopant, said process comprising the steps of in sequence:

forming a first insulating layer on a major surface of said wafer layer;

forming on the exposed surface of said first insulating layer an electrode layer of refractory material having a first window exposing said first insulating layer;

introducing a second type of dopant through said first window and through said insulating layer to form a first region of predetermined depth in said wafer layer:

forming a first mask layer at least over said first window including the walls thereof;

opening a second window between the walls of said first window, said second window extending only through said first mask layer and through said first insulating layer to expose said major surface;

introducing said second type of dopant through said second window to form a second region in said wafer layer extending from said major surface to a depth greater than said first region;

forming a second mask layer on said major surface within said second window;

removing at least said first mask layer and a portion of said first insulating layer to open a third window, said third window extending between the walls of said first window and said second mask layer to expose a portion of said major surface therebetween;

introducing said first type of dopant through said third window to form a third region in said wafer layer of lesser depth than said first region;

forming a second insulating layer on said last-recited exposed portion of said major surface and on the exposed surfaces of said electrode layer, said first insulating layer, and said second mask layer, respectively;

removing said second mask layer and substantially all of said second insulating layer within said first window, said last-recited removal step retaining said second insulating layer on said first window walls to define a fourth window therebetween, said fourth window exposing a portion of said major surface including portions of said second and third regions; and forming a metallized electrode in ohmic contact with said exposed portions of said second and third regions and extending out of said fourth window;

whereby a high surface dopant concentration level is obtained for said second region.

2. The method of claim 1 wherein a third insulating layer is formed on said refractory electrode layer following formation of the latter; and removing said third insulating layer during the step of opening said third window.

3. The method according to claim 1 wherein said first mask layer comprises silicon nitride.

4. The method according to claim 1 wherein the step of forming said second mask layer comprises growing said layer by thermal oxidation of said wafer material.

5. The method according to claim 1 wherein said first region is formed in said wafer layer by ion implantation of said second type of dopant and by subsequent heating.

6. The method according to claim 5 wherein said first and second types of dopants are N-type and P-type materials respectively.

7. The method according to claim 5 wherein said first and second types of dopants are P-type and N-type materials respectively.

8. The method according to claim 6 wherein said semiconductor wafer material comprises silicon.

9. The method according to claim 8 wherein the step of forming said second mask layer comprises growing said layer by thermal oxidation of said wafer material.

* * * * *